(12) United States Patent
Lu et al.

(10) Patent No.: US 11,882,683 B2
(45) Date of Patent: Jan. 23, 2024

(54) METHOD OF FORMING SEMICONDUCTOR MEMORY DEVICE HAVING SADDLE PORTION

(71) Applicants: UNITED MICROELECTRONICS CORP., Hsin-Chu (TW); Fujian Jinhua Integrated Circuit Co., Ltd., Quanzhou (CN)

(72) Inventors: Chien-Ming Lu, Kaohsiung (TW); Fu-Che Lee, Taichung (TW); Chien-Cheng Tsai, Kaohsiung (TW); Chiu-Fang Hsu, Miaoli County (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 181 days.

(21) Appl. No.: 17/561,663

(22) Filed: Dec. 23, 2021

(65) Prior Publication Data

US 2022/0122988 A1    Apr. 21, 2022

Related U.S. Application Data

(62) Division of application No. 15/910,015, filed on Mar. 2, 2018, now abandoned.

(30) Foreign Application Priority Data

Mar. 28, 2017 (CN) .......................... 201710192623.7

(51) Int. Cl.
*H10B 12/00* (2023.01)
*H01L 21/311* (2006.01)
(Continued)

(52) U.S. Cl.
CPC ..... *H10B 12/053* (2023.02); *H01L 21/02164* (2013.01); *H01L 21/3065* (2013.01);
(Continued)

(58) Field of Classification Search
CPC ......... H01L 21/76224; H01L 21/76229; H01L 27/10876; H01L 27/10823; H01L 27/10891; H10B 12/053; H10B 12/34
See application file for complete search history.

(56) References Cited

U.S. PATENT DOCUMENTS 7,701,002 B2    4/2010  Seo
8,435,847 B2    5/2013  Chun
(Continued)

FOREIGN PATENT DOCUMENTS

CN    104112746 A    10/2014
CN    104701171 A    6/2015

*Primary Examiner* — Nelson Garces
(74) *Attorney, Agent, or Firm* — Winston Hsu

(57) ABSTRACT

A method of forming a semiconductor memory device, the semiconductor memory device includes a plurality of active areas, a shallow trench isolation, a plurality of trenches and a plurality of gates. The active areas are defined on a semiconductor substrate, and surrounded by the shallow trench isolation. The trenches are disposed in the semiconductor substrate, penetrating through the active areas and the shallow trench isolation, wherein each of the trenches includes a bottom surface and a saddle portion protruded therefrom in each active areas. The gates are disposed in the trenches respectively.

6 Claims, 5 Drawing Sheets

(51) Int. Cl.
  *H01L 21/762*   (2006.01)
  *H01L 21/02*    (2006.01)
  *H01L 29/06*    (2006.01)
  *H01L 21/3065*  (2006.01)

(52) U.S. Cl.
  CPC .. *H01L 21/31116* (2013.01); *H01L 21/76224* (2013.01); *H01L 21/76229* (2013.01); *H01L 29/0653* (2013.01); *H10B 12/34* (2023.02); *H01L 21/02238* (2013.01); *H10B 12/488* (2023.02)

(56) References Cited

U.S. PATENT DOCUMENTS

| | | |
|---|---|---|
| 2008/0258206 A1 | 10/2008 | Hofmann |
| 2009/0269916 A1 | 10/2009 | Kang |
| 2012/0028434 A1 | 2/2012 | Lee |
| 2015/0294975 A1* | 10/2015 | Nakata .............. H01L 21/02247 257/334 |
| 2016/0071844 A1 | 3/2016 | Shen |
| 2017/0170313 A1* | 6/2017 | Chan ................. H01L 21/02387 |

* cited by examiner

METHOD OF FORMING SEMICONDUCTOR MEMORY DEVICE HAVING SADDLE PORTION

CROSS REFERENCE TO RELATED APPLICATIONS

This application is a Divisional of application Ser. No. 15/910,015 filed Mar. 2, 2018, and included herein by reference.

BACKGROUND OF THE INVENTION

1. Field of the Invention

The present invention relates generally to a semiconductor memory device and a method of fabricating the same. More particularly, the present invention relates to a dynamic random access memory (DRAM) device and a method of fabricating the same.

2. Description of the Prior Art

Along with the development of miniaturization of various electronic products, the design of the dynamic random access memory (DRAM) elements has to match the requirements of high integration and high density. For a dynamic random access memory with a recessed gate structure, since it can obtain a longer carrier channel length in the same semiconductor substrate to reduce the leakage of the capacitor structure, under a mainstream trend of development, it has gradually replaced a dynamic random access memory only having planar gate structure.

Generally, DRAM with a recessed gate structure is integrated by a large number of memory cells to form an array area for storing data. Each memory cell may be composed of a transistor in series with a charge storage device to receive voltage signals from the word line (WL) and bit line (BL). However, due to the product demands, the density of the memory cells in the array region needs to be continuously increased, which leads to the increasing difficulty and complexity of the related process and design. As a result, there are still many shortcomings in the conventional dynamic random access memory devices having a recessed gate structure. The performance and reliability of the related memory devices need to be further improved and enhanced.

SUMMARY OF THE INVENTION

The present invention provides a semiconductor memory device and a method of fabricating the same. The semiconductor memory device has a metal wire completely covering the entire channel region so as to effectively improve the device performance of the semiconductor memory device.

To achieve the above objective, the present invention provides a semiconductor memory device including a plurality of active areas, a shallow trench isolation, a plurality of trenches, and a plurality of gates. The active areas are defined on a semiconductor substrate and surrounded by the shallow trench isolation. The trenches are disposed in the semiconductor substrate, penetrating through the active areas and the shallow trench isolation, wherein each of the trenches includes a bottom surface and a saddle portion protruded therefrom in each active areas. The gates are disposed in the trenches respectively.

To achieve the above objective, the present invention provides a method of fabricating a semiconductor memory device including the following steps. First, a shallow trench isolation is formed in a semiconductor substrate to define a plurality of active areas. Next, a plurality of trenches is formed in the semiconductor substrate, penetrating through the shallow trench isolation, wherein each of the trenches includes an arc-shaped bottom surface in each active areas. Then, an etching process is performed to remove a portion of the arc-shaped bottom surface, thereby forming a planar bottom surface in the active areas, wherein the planar bottom surface has a saddle portion protruding upward.

The present invention mainly utilizes the oxidation and etching processes to form a trench with a saddle-like structure in the substrate, so as to serve as a gate trench of a buried word line. As a result, the metal wire of the buried word line can completely cover the channel region thereof, and the semiconductor memory device can achieve better device performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 are schematic views of steps of a method of fabricating a semiconductor memory device according to a preferred embodiment of the present invention, wherein:

FIG. 1 is a schematic top view of a semiconductor memory device at the beginning of the method;

FIG. 2 is a schematic cross-sectional view of a semiconductor memory device after forming a mask layer;

FIG. 3 is a schematic cross-sectional view of a semiconductor memory device taken along line AA' in FIG. 1;

FIG. 4 is a schematic cross-sectional view of a semiconductor memory device taken along line BB' in FIG. 1;

FIG. 5 is a schematic cross-sectional view of a semiconductor memory device after forming an oxide layer;

FIG. 6 is a schematic cross-sectional view of a semiconductor memory device after performing an etching process;

FIG. 7 is a schematic three-dimensional diagram of a semiconductor memory device after forming a trench;

FIG. 8 is a schematic cross-sectional view of a semiconductor memory device after forming a gate;

FIG. 9 is a schematic three-dimensional diagram of a semiconductor memory device after forming a bit line structure;

FIG. 10 is a schematic top view of a semiconductor memory device after forming a bit line structure.

DETAILED DESCRIPTION

In the following, the preferred embodiments of the present invention are described in order to enable those skilled in the art to further understand the present invention. The preferred embodiments may refer to the corresponding drawings to illustrate details of the constitution of the present invention and the effects to be achieved.

Figure 1:
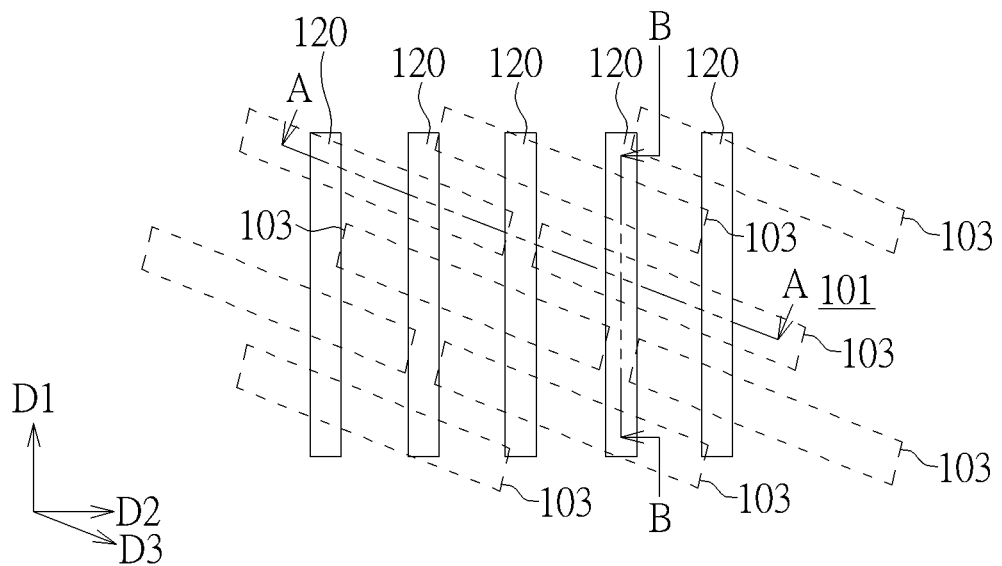
Figure 5:
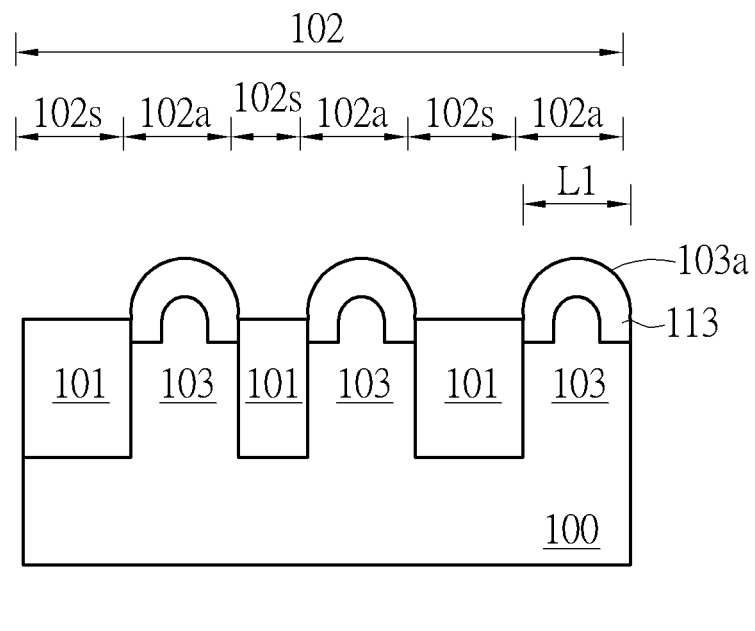
Figure 6:
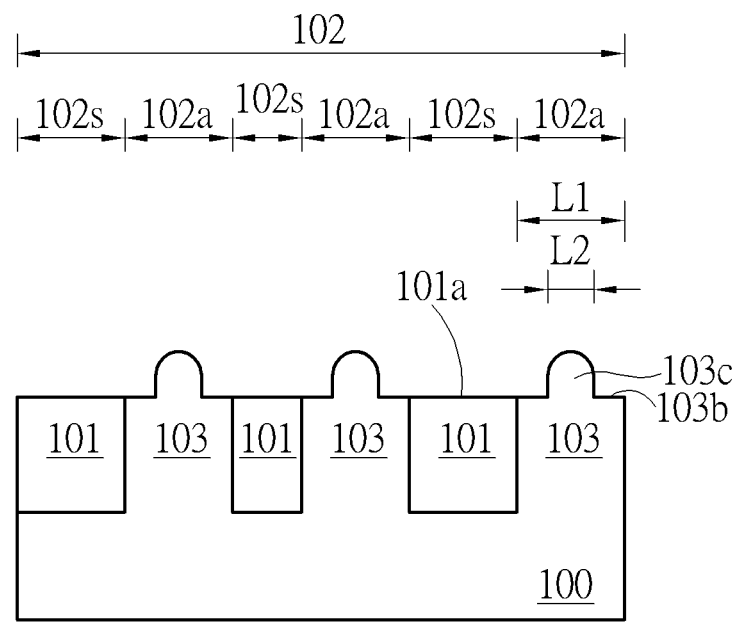
Figure 7:
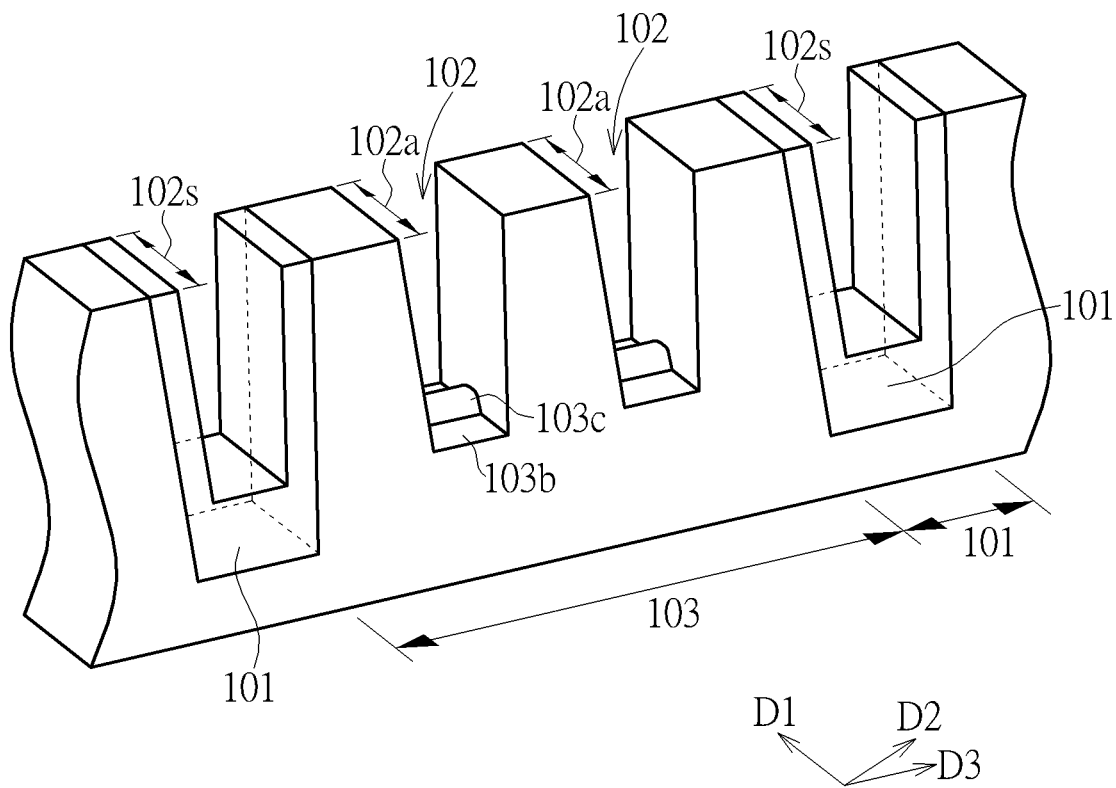
Figure 8:
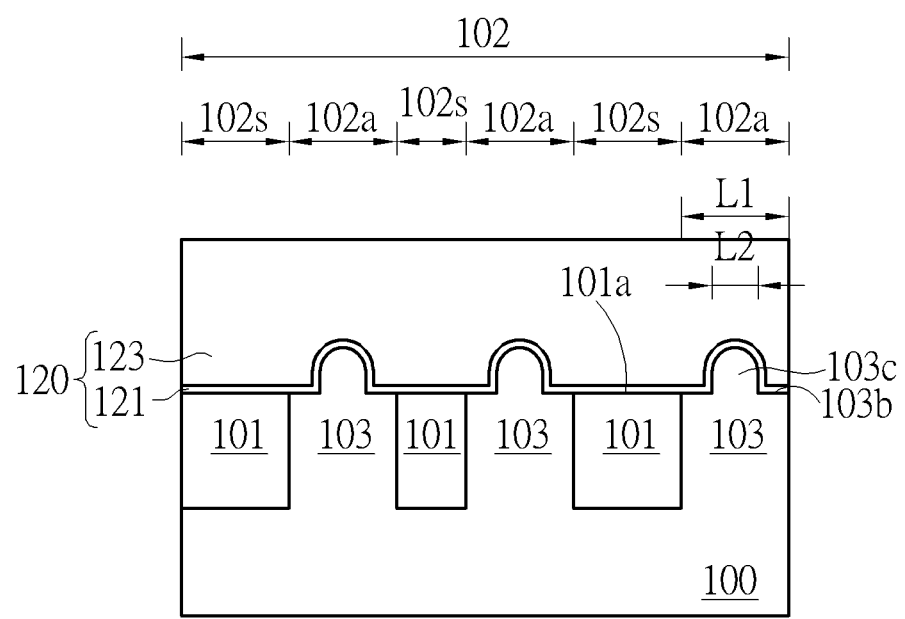
Figure 9:
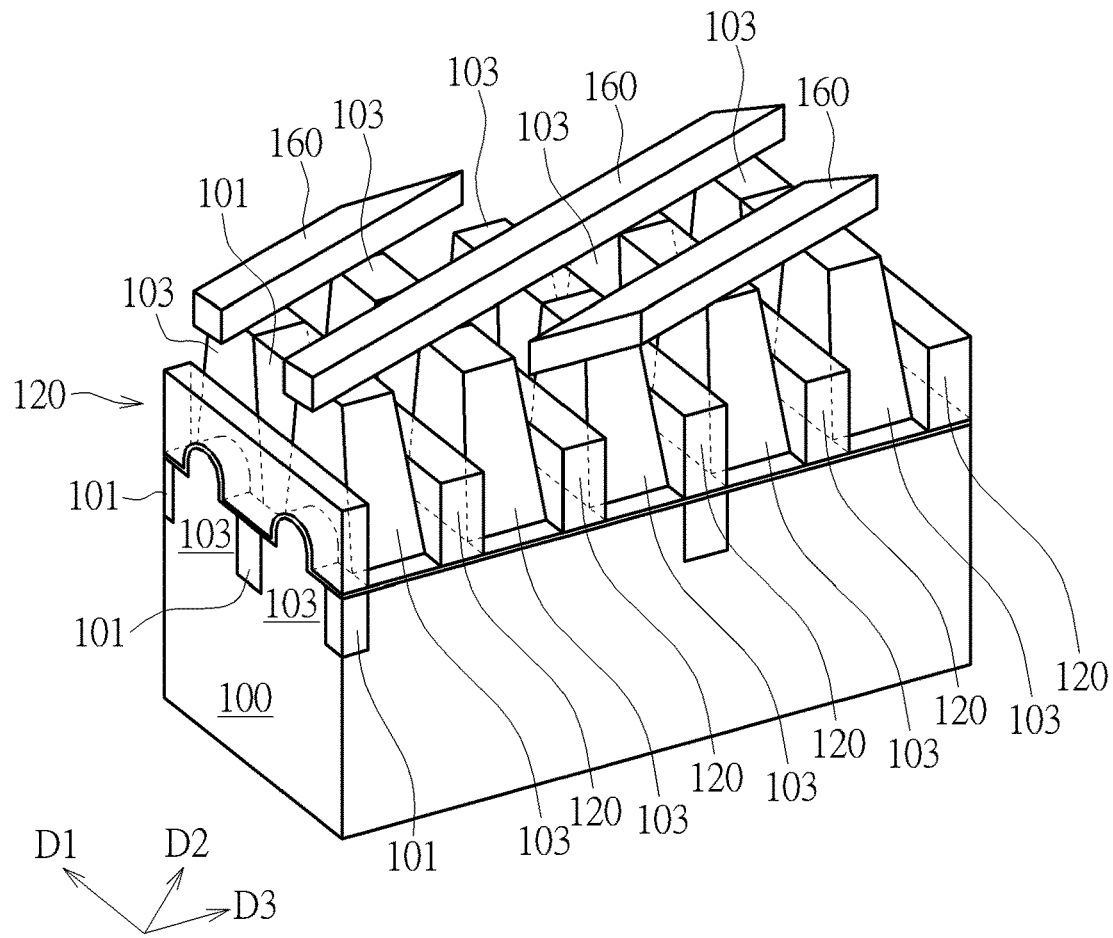
Figure 10:
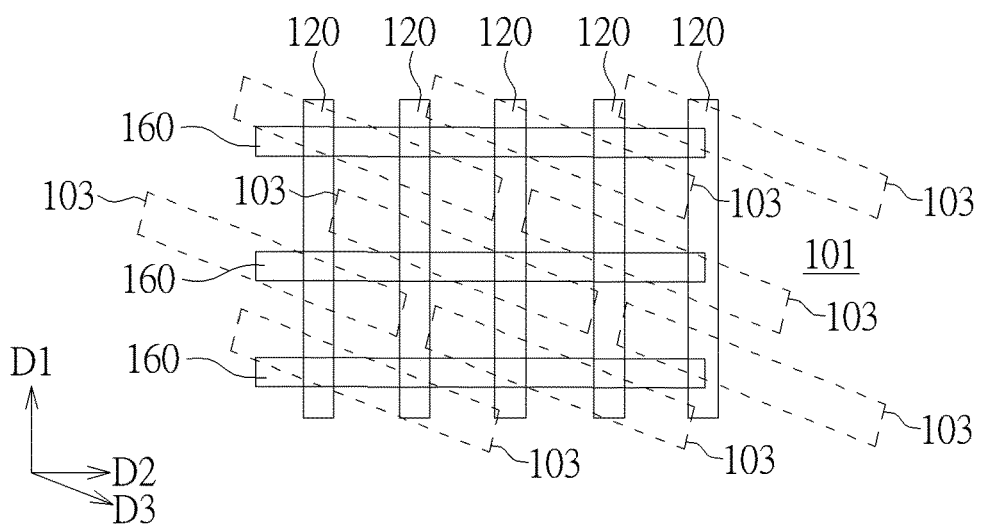

Please refer to FIG. 1 to FIG. 10, which are schematic views of steps of a method of fabricating a semiconductor memory device according to a preferred embodiment of the present invention, wherein FIG. 1 and FIG. 10 are schematic top views of a semiconductor memory device at the formation stage; FIG. 2 to FIG. 6 and FIG. 8 are schematic cross-sectional views of a semiconductor memory device at the formation stage; and FIG. 7 and FIG. 9 are a schematic top views of a semiconductor memory device at the formation stage. The present embodiment provides a method of fabricating a semiconductor memory device, which is, for example, a DRAM (dynamic random access memory) device. The semiconductor memory device includes at least one transistor (not shown in the drawings) and at least one capacitor (not shown in the drawings), as the smallest memory cell in the DRAM array and receives voltage signals from the bit line (BL) 160 and the word line (WL) 120.

First, a substrate 100, such as a silicon substrate, an epitaxial silicon substrate or a silicon on insulator (SOI) substrate, is provided. At least one shallow trench isolation (STI) is formed in the substrate 100, to define a plurality of active areas (AA) 103 surrounded by the shallow trench isolation 101, the active areas 103 are parallel to each other and extend along a third direction D3. In one embodiment, the shallow trench isolation 101 is formed by, for example, first performing an etching process to form a plurality of trenches in the substrate 100, then filling an insulating material (such as silicon oxide or silicon oxynitride) in the trenches, but is not limited thereto.

Furthermore, a plurality of gates is formed in the substrate 100, for example, buried gates 120, as shown in FIG. 1. In this embodiment, the buried gates 120 parallelly extend along a first direction D1 different from the third direction D3 in the substrate 100, to simultaneously cross a portion of the active areas 103 and the shallow trench isolation 101, so as to function like the buried word lines (BWLs) of the semiconductor memory device. For example, the buried gates 120 are formed by forming a plurality of trenches 102 in the substrate 100, penetrating through the active areas 103 and the shallow trench isolation 101, and then forming a wire filling the trench 102 in each trench 102.

Figure 2:
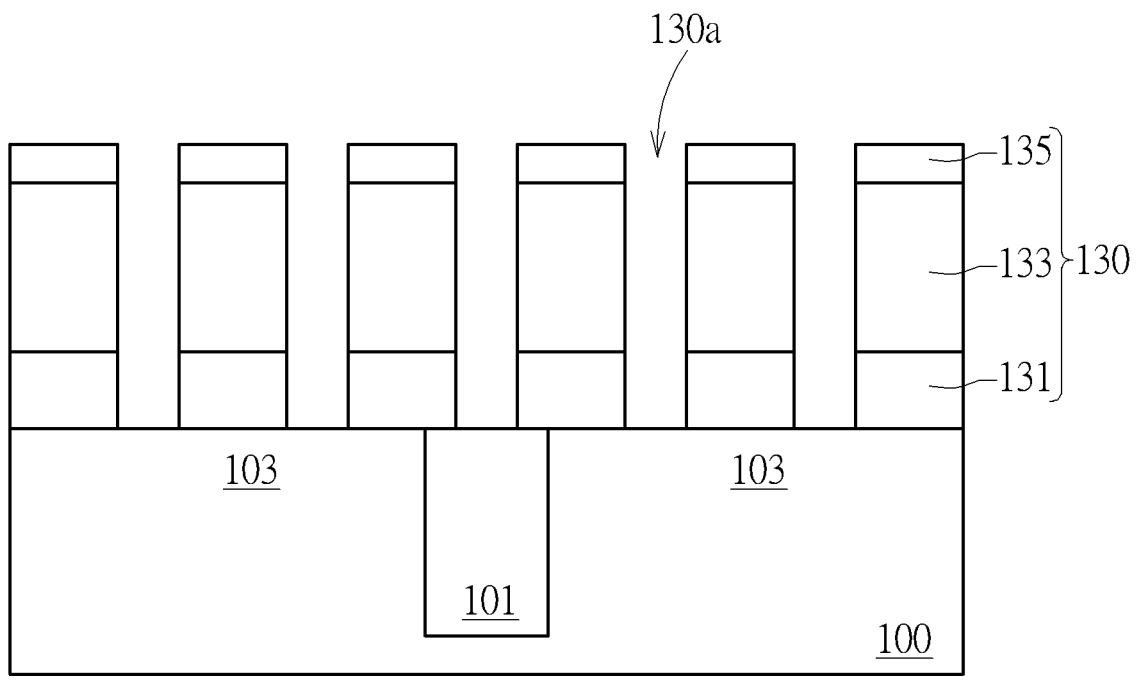
Figure 3:
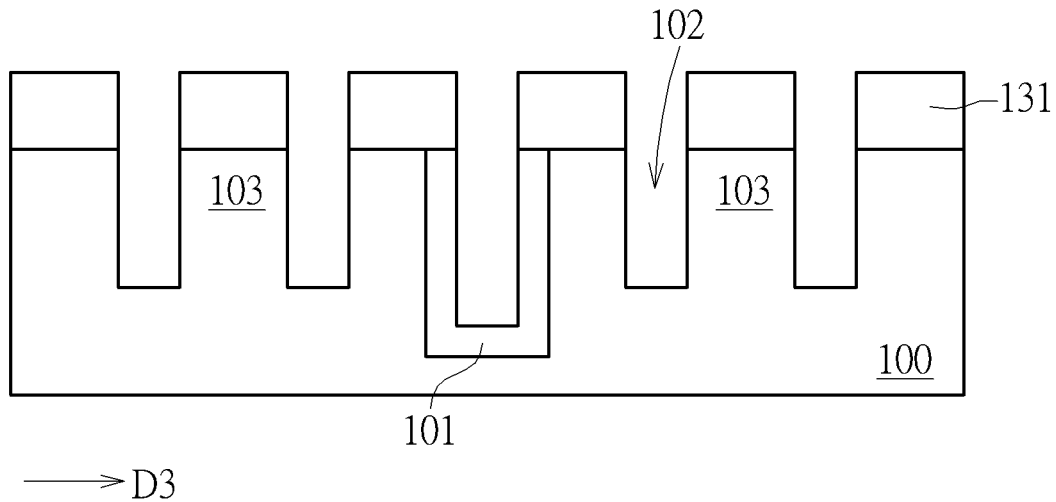

Specifically, the trench 102 is defined by a patterned mask layer 130 formed on the substrate 100. The patterned mask layer 130 may have a multilayer structure consisted of, for example, a first mask layer 131 including such as silicon oxide ($SiO_2$), a second mask layer 133 including, for example, an advanced pattern film (APF) provided by Applied Materials Company, and a third mask layer 135 including materials such as silicon nitride (SiN), as shown in FIG. 2. Next, an etching process, for example, a dry etching process, is performed to transfer the opening pattern 130a of the patterned mask layer 130 into the substrate 100 below to form the trenches 102, as shown in FIG. 3, which is a schematic cross-sectional view of a semiconductor memory device taken along line AA'. Then, a portion of the patterned mask layer 130, for example, the third mask layer 135 and the second mask layer 133, are removed.

Figure 4:
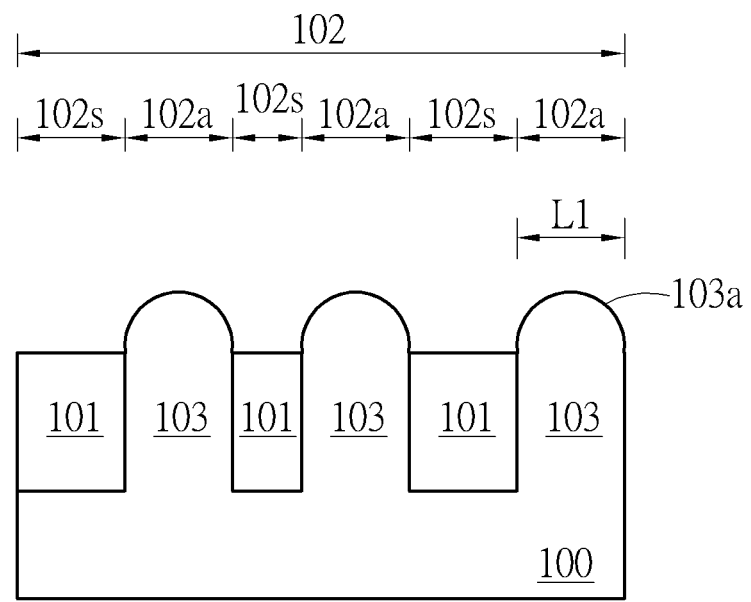

It should be noted that the trench 102 is formed to penetrate through the active area 103 and the shallow trench isolation 101 at the same time. Therefore, during the etching process, the active area 103 and the shallow trench isolation 101 containing different materials may be removed simultaneously. Alternatively, the active area 103 and the shallow trench isolation 101 may be removed sequentially. In this embodiment, a removing process of the shallow trench isolation 101, such as a first dry etching process, is performed first. The first dry etching process utilizes an etchant to etch shallow trench isolation 101 within a higher etching selectivity related to the active area 103 in about 10 or more than 10, but is not limited thereto. Thus, a portion 102s of the trench 102 within the shallow trench isolation 101 may be first formed to obtain a planar bottom surface, as shown in FIG. 4, which is a schematic cross-sectional view taken along the line BB'. On the other hand, during the first dry etching process, the active areas 103 (i.e., the substrate 100) adjacent to the portion 102s of the trench 102 within the shallow trench isolation 101 is simultaneously affected by the first dry etching process, so that the corners of the active areas 103 are slightly etched into a round corner (not shown in the drawings). Subsequently, a removal process of the active areas 103, such as a second dry etching process, is performed. The second dry etching process utilizes another etchant for specifically etching the active areas 103 (i.e., the substrate 100). Thus, a portion 102a of the trench 102 within each active areas 103 is formed, and which is partially located above the portion 102s of the trench 102 within the shallow trench isolation 101 to perform an arc-shaped bottom surface 103a, as shown in FIG. 4. The arc-shaped bottom surface 103a has the same length L1 as the active area 103 in a projection direction (not shown in the drawings) perpendicular to the substrate 100.

Next, a treatment process is performed to the arc-shaped bottom surface 103a such that a modified layer, for example, an oxide layer 113 is formed thereon. In this embodiment, an oxidation process, such as an oxygen-containing process or an in-situ steam generation (ISSG) process, is preferably performed, wherein the nitrous oxide ($N_2O$) and oxygen ($O_2$) are introduced to oxide the portion 102a of the trench 102 in the active areas 103 from original material such as silicon or epitaxial silicon to silicon oxide, thereby forming a oxide layer 113, but is not limited thereto. It should be noted that although the oxidation process mainly occurs on the arc-shaped bottom surface 103a, at least a portion of the substrate 100 adjacent to the arc-shaped bottom surface 103a is still affected by the oxidation process. Therefore, two ends of the oxide layer 113 may further extend downwardly till under the planar bottom surface of the portion 102s of the trench 102 in the shallow trench isolation 101, such that the oxide layer 113 has a vaulted shape having both ends extending under the shallow trench isolation 101, as shown in FIG. 5.

Then, a removing process of the oxide layer 113 is performed, for example, a soft-etching process. The present embodiment uses a SiCoNi pre-cleaning process to remove the oxide layer 113, wherein the process is performed by utilizing plasma and exposing the oxide layer 113 under a circumstance containing nitrogen trifluoride ($NF_3$) gas and ammonia ($NH_4OH$) gas. In addition, hydrogen ($H_2$) or hydrogen fluoride (HF) may be added to the plasma if necessary. Therefore, after the oxide layer 113 is completely removed, a saddle-like structure may be formed in each portion 102a of the trench 102 in each active areas 103. The saddle-like structure includes a planar bottom surface 103b and a protruding saddle portion 103c, as shown in FIG. 6 and FIG. 7. The saddle portion 103c is also arc-shaped, and has a length L2 in the projection direction smaller than the length L1 of the active area 103 in the projection direction. A curvature ($\kappa$) of a top surface of the saddle portion 103c is greater than a curvature of a top surface of the arc-shaped bottom surface 103a. On the other hand, during the removing process of the oxide layer 113, the shallow trench isolations 101 located on both sides of the oxide layer 113 are also partially removed to form a bottom surface 101a flush with the bottom surface 103b. Furthermore, during the removal process of the oxide layer 113, the first mask layer 131 may also be removed at the same time, but is not limited thereto.

Subsequently, as shown in FIG. 8, a deposition process, an etching process, and a planarization process are sequentially performed to form metal wires filling the trenches 102. Specifically, the formation of the metal wire includes the following steps: First, a gate dielectric layer 121 is conformally covered the surface of each of the trenches 102, wherein the gate dielectric layer 121 includes, for example, a dielectric material such as silicon oxide; next, a gate layer 123 is formed on the gate dielectric layer 121, wherein the gate layer may include, for example, a low-resistance metal material such as tungsten (W), aluminum (Al) or copper (Cu); and a capping layer (not shown in the drawings) is formed to fill each of the trenches 102 and flush with the shallow trench isolations 101, wherein the capping layer may include for example, silicon nitride. Thus, the buried gate 120 is formed. It should be noted that the saddle portion 103c having the smaller length L2 is formed in the portion 102a of the trenches 102 located in the active region 103, so that the subsequently formed gate layer 123 and the gate dielectric layer 121 are able to completely cover the saddle portion 103c, as shown in FIG. 8.

Then, as shown in FIG. 9 and FIG. 10, a plurality of bit lines 160 is formed on the substrate 100. The bit lines 160 are parallel to each other and extend along a second direction D2 perpendicular to the extending direction of the buried gate 120 (i.e., the first direction D1). At same time, the bit lines 160 cross the active areas 103 and the buried gate 120 located in the substrate 100, wherein portions of the bit lines 160 right across the active areas 103 are close to the bottom surface 103b, and the portions are higher than the bottom surface 103b, as shown in FIG. 9. In one embodiment, each of the bit lines 160 at least includes a conductive layer (not shown in the drawings), a barrier layer and a metal layer (not shown in the drawings) stacked in sequence, wherein the conductive layer for example includes a semiconductor material like polysilicon or amorphous silicon, the barrier layer for example includes titanium (Ti) or titanium nitride (TiN), and the metal layer for example includes a low-resistance metal such as tungsten, aluminum or copper, but is not limited thereto.

Thus, the method of fabricating a semiconductor memory device in the preferred embodiment of the present invention is completed. According to the formation method of the present embodiment, the trench 102 is first formed to penetrate through the active areas 103 and the shallow trench isolation 101 at the same time, so that each portion 102a of the trench 102 in each active area 103 may have an arc-shaped bottom surface 103a. Next, a treatment process such as an oxygen-containing process or an in-situ steam generation (ISSG) process is performed to the arc-shaped bottom surface 103a to form a vaulted shape oxide layer 113 thereon. After that, the oxide layer 113 is removed, so that a saddle-like structure may be formed in the portions 102a of the trench 102 in the active areas 103, wherein the saddle-like structure includes a planar bottom surface 103b and a protruding saddle portion 103c. Since the saddle portion 103c has a small length and a large curvature, it can be integrally covered with the gate dielectric layer 121 and the gate layer 123 formed subsequently, thereby forming a buried word line. Accordingly, the metal wire of the buried word line can completely cover the channel region thereof, and the semiconductor memory device can achieve better device performance thereby.

Overall, the present invention mainly utilizes the oxidation and etching processes to form a trench with a saddle-like structure in the substrate, so as to serve as a gate trench of a buried word line. As a result, the metal wire of the buried word line can completely cover the channel region thereof, and the semiconductor memory device can achieve better device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of fabricating a semiconductor memory device, comprising:
    forming a shallow trench isolation in a semiconductor substrate to define a plurality of active areas;
    forming a plurality of trenches in the semiconductor substrate, penetrated through the active areas and the shallow trench isolation, wherein each of the trenches comprises an arc-shaped bottom surface in each active area, and a maximum length of the arc-shaped bottom surface in a projection direction is equal to a length of the active area; and
    performing an etching process to remove the arc-shaped bottom surface, thereby forming a planar bottom surface and a saddle portion protruding upward in the active areas, wherein a maximum length of the saddle portion in the projection direction is smaller than the length of the active area, and the bottom surface is coplanar with a top surface of the trench in the shallow trench isolation.
2. The method of fabricating a semiconductor memory device according to claim 1, wherein the method further comprises:
    performing an oxidation of the arc-shaped bottom surface before the etching process is performed.
3. The method of fabricating a semiconductor memory device according to claim 1, wherein the etching process comprises a soft-etching process.
4. The method of fabricating a semiconductor memory device according to claim 1, wherein the formation of the trenches comprises:
    performing a removal process of the shallow trench isolation; and
    performing a removal process of the semiconductor substrate to form the trenches.
5. The method of fabricating a semiconductor memory device according to claim 1, wherein the method further comprises:
    forming a plurality of gates, disposed in the trenches respectively; and
    forming a plurality of bit lines, disposed on the semiconductor substrate, wherein the bit lines cross the active areas and the gates.
6. The method of fabricating a semiconductor memory device according to claim 1, wherein a curvature of the saddle portion is greater than a curvature of the arc-shaped bottom surface.

* * * * *